US011829241B2

(12) United States Patent
McLaren et al.

(10) Patent No.: US 11,829,241 B2
(45) Date of Patent: *Nov. 28, 2023

(54) SERIALIZING AND DESERIALIZING STAGE TESTING

(71) Applicant: Cadence Design Systems, San Jose, CA (US)

(72) Inventors: Angus William McLaren, Toronto (CA); Robert A. Heaton, Durham, NC (US); Aaron Ali, Holland Landing (CA); Frederick A. Ware, Los Altos Hills, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/840,153

(22) Filed: Jun. 14, 2022

(65) Prior Publication Data

US 2022/0374306 A1 Nov. 24, 2022

Related U.S. Application Data

(63) Continuation of application No. 16/973,142, filed as application No. PCT/US2019/037211 on Jun. 14, 2019, now Pat. No. 11,392,452.

(Continued)

(51) Int. Cl.
*G06F 11/10* (2006.01)
*H03M 13/09* (2006.01)

(52) U.S. Cl.
CPC ...... *G06F 11/1048* (2013.01); *G06F 11/1032* (2013.01); *H03M 13/09* (2013.01)

(58) Field of Classification Search
None
See application file for complete search history.

(56) References Cited

U.S. PATENT DOCUMENTS 4,346,474 A * 8/1982 Sze .................. H04L 1/0057
714/802
4,791,643 A * 12/1988 Molstad .............. H03M 13/31
(Continued)

FOREIGN PATENT DOCUMENTS

EP 1821409 B1 8/2007

OTHER PUBLICATIONS

Tutt, "Parity Generate and Check Circuit"—(ip.com Archival version dated Oct. 1982), (IBM) (Year: 1982).*

(Continued)

*Primary Examiner* — April Y Blair
*Assistant Examiner* — Matthew W Wahlin
(74) *Attorney, Agent, or Firm* — Mark Whittenberger, Esq.; Holland & Knight LLP

(57) ABSTRACT

A first serializing stage is provided with a stream of data words composed of sub-words that each have values that associate each of the sub-words with the same error detection code value. For example, the values selected for each sub-word may each be associated with even parity. One or more serializing stages time-multiplex the sub-words into a stream of sub-word sized data. At the serializing stage that receives sub-word sized data stream, the data is checked to determine whether any of the sub-words is no longer associated with the error detection code value. Serializing/deserializing stages are selectively controlled to replace one or more data bits from a word being serialized/deserialized with an error detecting code value (e.g., parity). A subsequent serializing/deserializing stage is enabled to use the inserted error detecting code values and the data in the received words to determine whether an error has occurred.

20 Claims, 14 Drawing Sheets

Related U.S. Application Data

(60) Provisional application No. 62/690,222, filed on Jun. 26, 2018.

(56) References Cited

U.S. PATENT DOCUMENTS

| | | |
|---|---|---|
| 6,009,548 A | 12/1999 | Chen et al. |
| 6,374,389 B1 | 4/2002 | Tuma et al. |
| 6,865,222 B1 | 3/2005 | Payne |
| 7,944,236 B2 * | 5/2011 | How .................. G06F 13/4022 |
| | | 326/38 |
| 8,589,759 B2 | 11/2013 | Cox et al. |
| 8,630,821 B2 | 1/2014 | Li et al. |
| 11,392,452 B2 * | 7/2022 | McLaren ............ G06F 11/1032 |

OTHER PUBLICATIONS

Notification of Transmittal of the International Search Report and the Written Opinion of the International Searching Authority, or the Declaration dated Aug. 29, 2019 re: Int'l Appln. No. PCT/US19/037211. 19 Pages.

\* cited by examiner

INPUT STAGE (8-BIT WIDE – NO PARITY)

| A | B | C | D | E | F | G | H |
|---|---|---|---|---|---|---|---|

STAGE #1 (8-BIT WIDE)

| P(BCDEFGH) | B | C | D | E | F | G | H |
|---|---|---|---|---|---|---|---|

STAGE #2 (4-BIT WIDE)

| P(BCD) | B | C | D | 1st |
|---|---|---|---|---|
| P(FGH) | F | G | H | 2nd |

STAGE #3 (2-BIT WIDE)

| P(B) | B | 1st |
|---|---|---|
| P(D) | D | 2nd |
| P(F) | F | 3rd |
| P(H) | H | 4th |

STAGE #4 (1 BIT WIDE)

| P(B) | 1st |
|---|---|
| B | 2nd |
| P(D) | 3rd |
| D | 4th |
| P(F) | 5th |
| F | 6th |
| P(H) | 7th |
| H | 8th |

*FIG. 10*

SERIALIZING AND DESERIALIZING STAGE TESTING

BRIEF DESCRIPTION OF THE DRAWINGS

FIG. 10 is a diagram illustrating examples of parity insertion by serializing stages.

DETAILED DESCRIPTION OF THE EMBODIMENTS

In an embodiment, a first serializing stage is provided with a stream of data words composed of sub-words that each have values that associate each of the sub-words with the same error detection code value. For example, the values selected for each sub-word may each be associated with even parity. One or more serializing stages time-multiplex the sub-words into a stream of sub-word sized data. At the serializing stage that receives the sub-word sized data stream, the data is checked to determine whether any of the sub-words is no longer associated with the expected error detection code value. If one or more of the sub-words fails this test, an error indicator is set.

In an embodiment, serializing/deserializing stages are selectively controlled (e.g., by a mode bit) to replace one or more data bits from a word being serialized/deserialized with an error detecting code value (e.g., parity). A subsequent serializing/deserializing stage is enabled to use the inserted error detecting code values and the data in the received words to determine whether an error has occurred. If an error has occurred in the received words, an error indicator is set.

Figure 1:
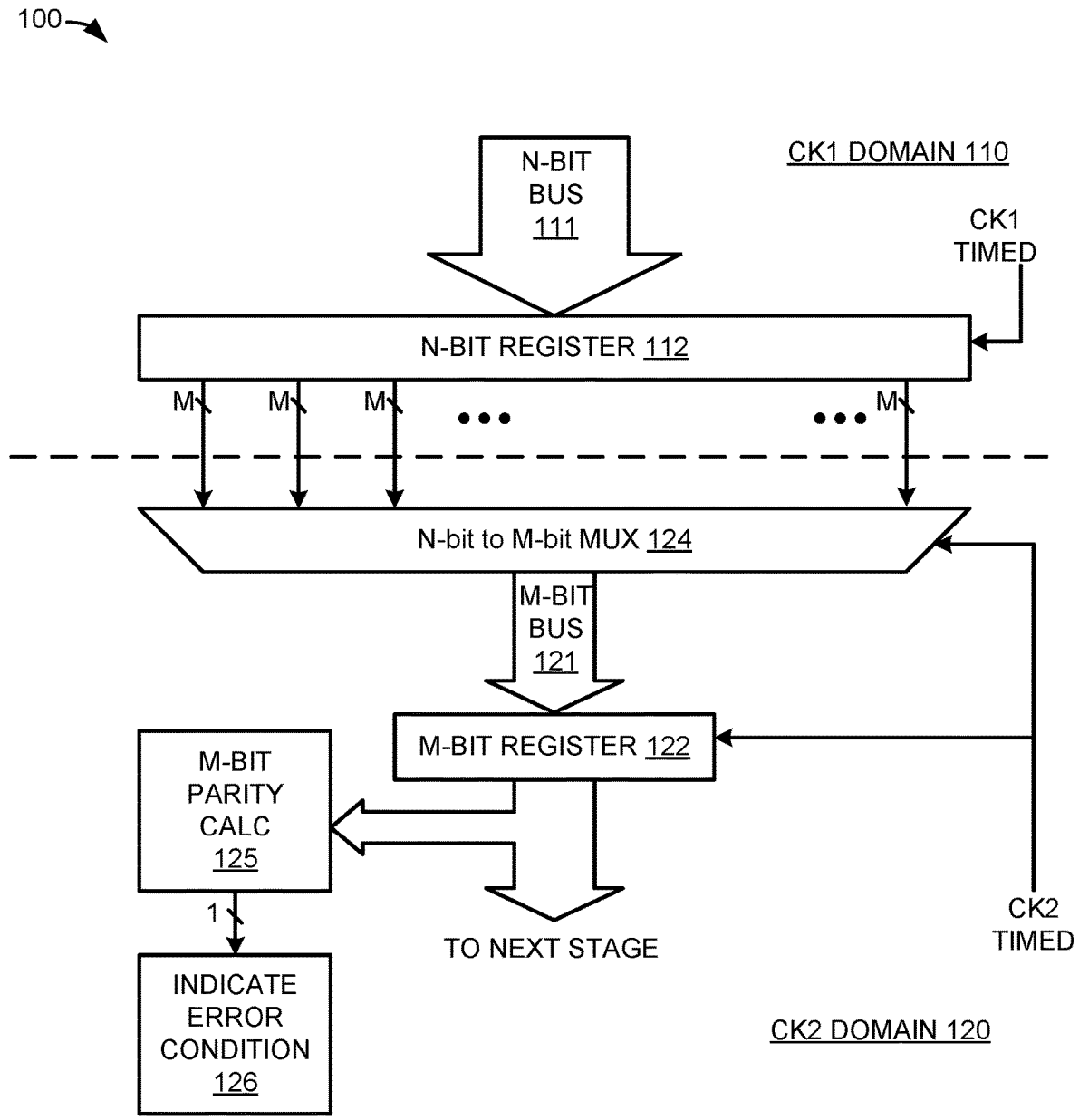
FIG. 1 is a block diagram illustrating a serializing stage test configuration.

FIG. 1 is a block diagram illustrating a serializing stage test configuration. In FIG. 1, serializing stages 100 comprise first clock domain (CK1) 110 and second clock domain (CK2) 120. In an embodiment, serializing stages 100 are part of an integrated circuit (e.g., memory integrated circuit, serializer/deserializer integrated circuit, processor integrated circuit, etc.) First clock domain CK1 110 and second clock domain CK2 120 are synchronized by timing references (e.g., CK1 and CK2) that are switching at different frequencies. CK1 domain 110 includes an N-bit bus 111 and N-bit register 112. CK2 domain includes N-bit to M-bit multiplexor (MUX) 124, M-bit bus 121, M-bit register 122, M-bit parity calculation circuitry 125, and error condition indicator 126. N-bit bus 111 is input to N-bit register 112. N-bit register 112 is synchronized (e.g., clocked) to latch the values from N-bit bus 111 based on a CK1 timed signal. The output of N-bit register 112 is input to MUX 112 in M-bit words, where N is greater than M. In an embodiment, N is an integer multiple (e.g., ×2, ×3, ×4, etc.) of M.

MUX 124 receives the output of N-bit register 112 and sequentially outputs a series of M-bit words to M-bit bus 121. The timing of the series is synchronized (e.g., clocked) to output the M-bit words, serially, to M-bit bus 121 based on a CK2 timed signal. M-bit bus 121 is input to M-bit register 122. M-bit register 122 is synchronized (e.g., clocked) to latch the values from M-bit bus 121 based on a CK2 timed signal. The output of M-bit register 122 is input to M-bit parity calculation circuitry 125. The parity calculated by M-bit parity calculation 125 is input to error condition indicator 126.

In an embodiment, error condition indicator 126 is set whenever the output of M-bit parity calculation 125 is not an expected value (e.g., always a logical '0'). Once set, error condition indicator 126 stays set until cleared by control circuitry (not shown in FIG. 1). Thus, a sequence of N-bit words that is composed of M-bit words can be serialized into a stream of M-bit words with parity of each of the M-bit words being checked in real-time. If an error occurs, error condition indicator 126 is set, and stays set, such that the aggregate result of the parity checks on the serialized stream of M-bits are valid after the entire sequence of N-bit words has been serialized.

To test for errors during the serialization process, N-bit bus 111 may be provided with a test N-bit parallel data stream, synchronized with CK1, where each M-bit word that makes up the N-bit words of the data stream have values that result in the same parity (e.g., even or odd). To illustrate, consider the case where N=64 and M=8. An example N-bit word suitable for use in the test data stream is 0x0324A5F3BD39C0FA. Once serialized (i.e., by MUX 124), the M=8-bit data stream is the sequence: 0x03, 0x24, 0xA5, 0xF3, 0xBD, 0x39, 0xC0, and 0xFA. Each of these bytes in the sequence evaluates to even parity. Thus, the output sequence from parity calculation 125 would be the sequence: 0, 0, 0, 0, 0, 0, 0, 0. Accordingly, when error condition indicator 126 is configured to be set if a '1' occurs in the parity sequence, no error condition would be signal. In contrast, however, if during serialization an error occurs in one bit of the 0x24 byte turning it into 0x25, the output sequence from parity calculation 125 would be the sequence: 0, 1, 0, 0, 0, 0, 0, 0. The '1' in this sequence would set the error condition indicator to indicate an error condition.

It should be understood that parity is an example of an error detecting code. Other error detecting codes (e.g., multi-bit parity, or an error correcting code—ECC, may be employed to determine whether one or more bits of the N-bit data stream were changed by serializing circuitry 100.

Figure 2:
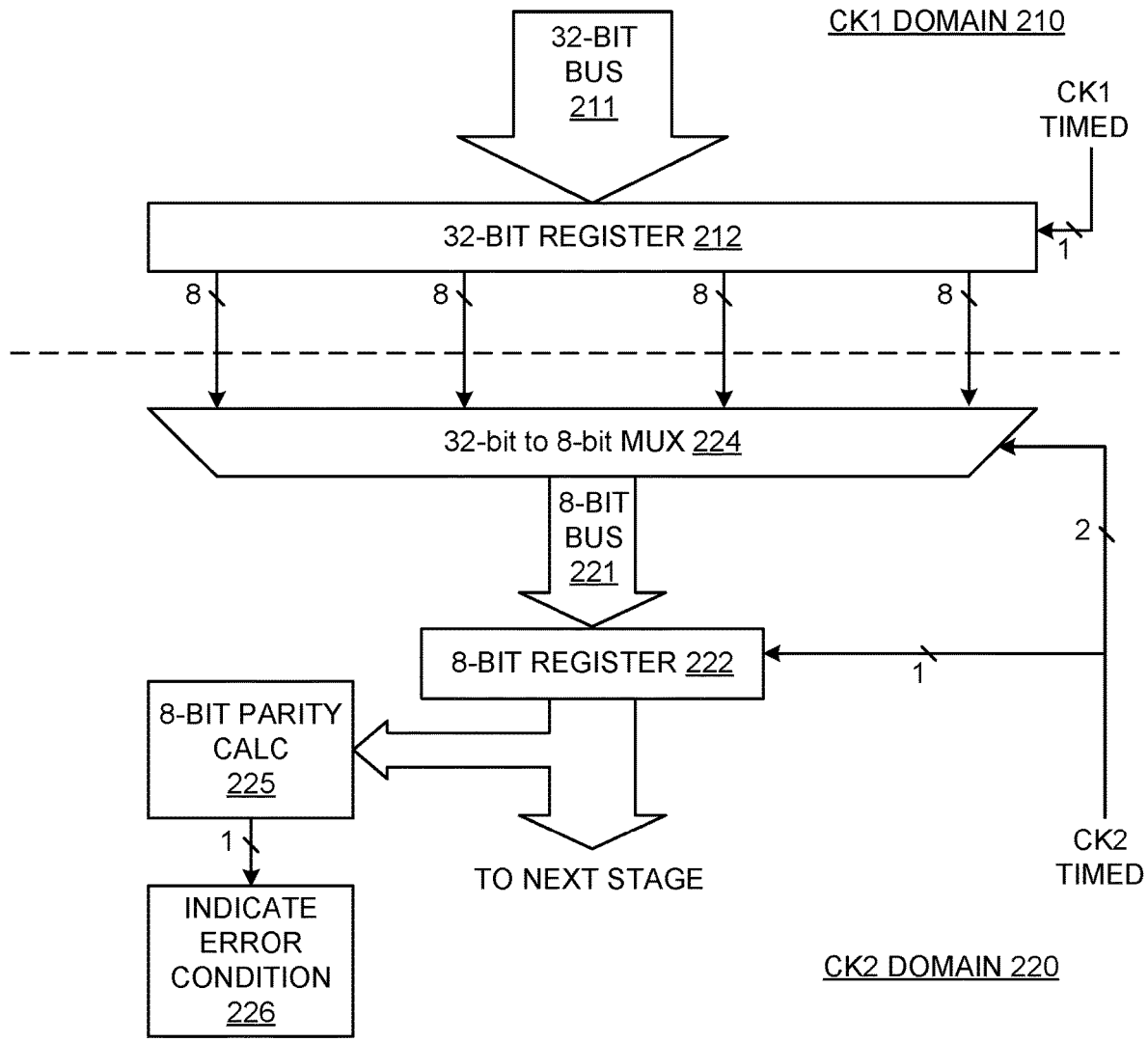
FIG. 2 is a block diagram illustrating an example 32 to 8 serializing stage test configuration.

FIG. 2 is a block diagram illustrating an example 32 to 8 serializing stage test configuration. In FIG. 2, serializing stages 200 comprise first clock domain (CK1) 210 and second clock domain (CK2) 220. In an embodiment, serializing stages 200 are part of an integrated circuit (e.g., memory integrated circuit, serializer/deserializer integrated circuit, processor integrated circuit, etc.) First clock domain CK1 210 and second clock domain CK2 220 are synchronized by timing references (e.g., CK1 and CK2) that are switching at different frequencies. CK1 domain 210 includes a 32-bit bus 211 and 32-bit register 212. CK2 domain includes 32-bit to 8-bit multiplexor (MUX) 224, 8-bit bus 221, 8-bit register 222, 8-bit parity calculation circuitry 225, and error condition indicator 226. 32-bit bus 211 is input to 32-bit register 212. 8-bit register 212 is synchronized (e.g., clocked) to latch the values from 8-bit bus 211 based on a CK1 timed signal. The output of 32-bit register 212 is input to MUX 212 in 32-bit words.

MUX 224 receives the output of 32-bit register 212 and sequentially outputs a series of 8-bit words to 8-bit bus 221. The timing of the series is synchronized (e.g., clocked) to output the M-bit words, serially, to 8-bit bus 221 based on a CK2 timed signal. 8-bit bus 221 is input to 8-bit register 222. 8-bit register 222 is synchronized (e.g., clocked) to latch the values from 8-bit bus 221 based on a CK2 timed signal. The output of 8-bit register 222 is input to 8-bit parity calculation circuitry 225. The parity calculated by 8-bit parity calculation 225 is input to error condition indicator 226.

In an embodiment, error condition indicator 226 is set whenever the output of 8-bit parity calculation 225 is not a selected value (e.g., always a logical '0' indicating even parity, or always a logical '1' indicating odd parity). Once set, error condition indicator 226 stays set until cleared by control circuitry (not shown in FIG. 2). Thus, a sequence of 32-bit words (each 32-bit word being composed of four bytes) can be serialized into a stream of bytes with the parity of each of the bytes being checked in real-time. If an error occurs, error condition indicator 226 is set, and stays set, such that the aggregate result of the parity checks on the serialized stream of bytes are valid after the entire sequence of 32-bit words has been serialized.

To test for errors during the serialization process, 32-bit bus 211 may be provided with a test 32-bit parallel data stream, synchronized with CK1, where each byte that makes up the 32-bit words of the data stream have values that result in the same parity (e.g., even or odd). An example sequence of 32-bit words suitable for use in the test data stream is 0x71BB721E followed by 0xD48B21CF. Once serialized (i.e., by MUX 224), the data stream of bytes is the sequence: 0x71, 0xBB, 0x72, 0x1E, 0xD4, 0x8B, 0x21, and 0xCF. Each of the bytes in this sequence evaluates to even parity. Thus, the output sequence from parity calculation 225 would be the sequence: 0, 0, 0, 0, 0, 0, 0, 0. Accordingly, when error condition indicator 226 is configured to be set if a '1' occurs in the parity sequence, no error condition would be signaled. In contrast, however, if, during serialization, an error occurs in one bit of the 0x21 byte turning it into, for example, 0x22, the output sequence from parity calculation 225 would be the sequence: 0, 0, 0, 0, 0, 0, 1, 0. The '1' in this sequence would set the error condition indicator to indicate an error condition.

Figure 3:
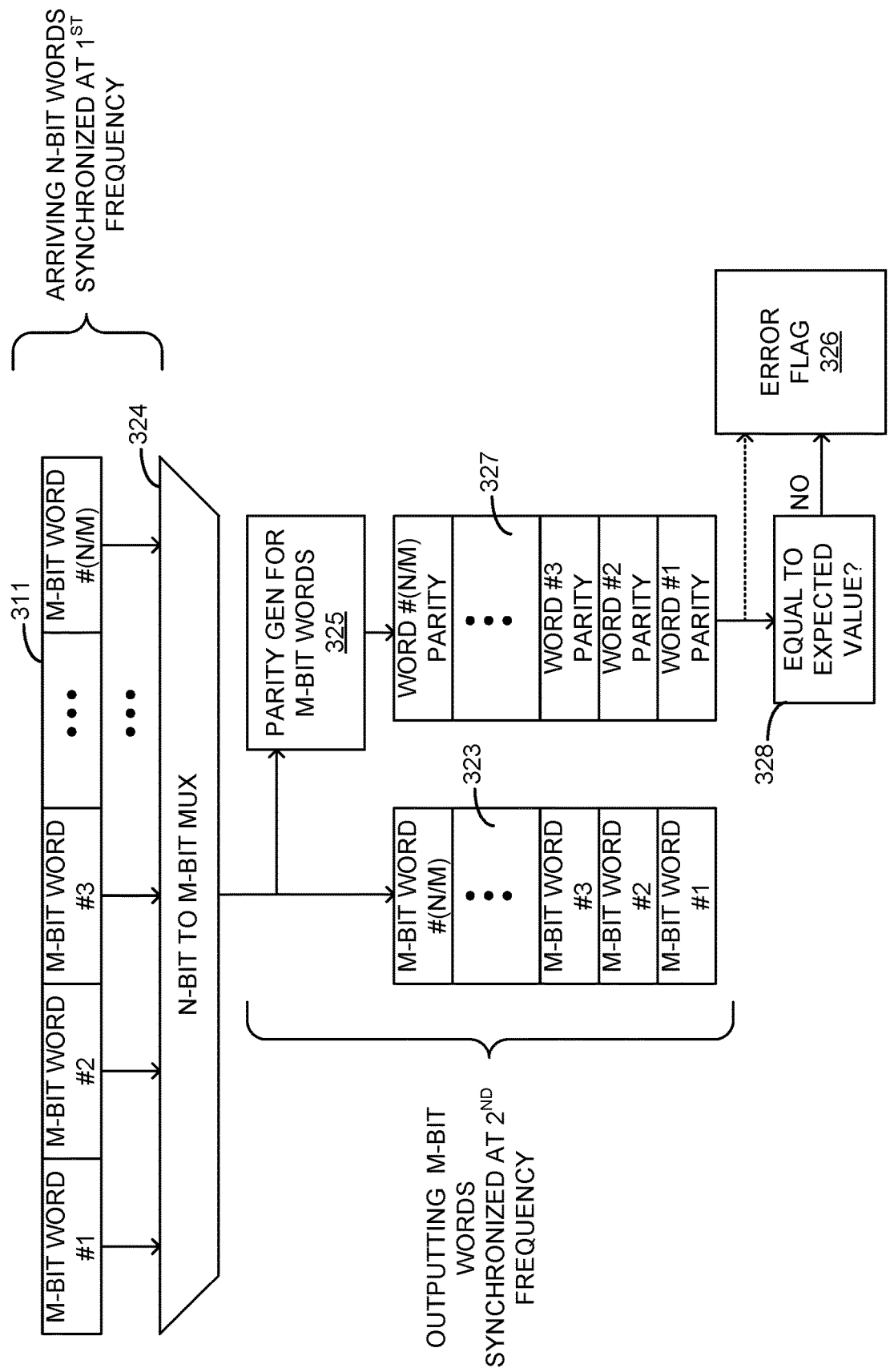
FIG. 3 is a diagram illustrating the operation of a serializing stage test configuration.

FIG. 3 is a diagram illustrating of the operation of a serializing stage test configuration. In FIG. 3, N-bit words 311 are arriving synchronized at a first frequency. N-bit words 311 are composed of N/M M-bit words. The value of each of the M-bit words is selected (e.g., by a test pattern generator program) to have the same parity as all of the other M-bit words. The N-bit words 311 are input to multiplexor 324. Multiplexor 324 successively outputs the M-bit words 323 synchronized a second frequency. The M-bit words are also input to a parity generation circuit 325 to evaluate the respective parity of each of the M-bit words. The parity generation circuit 325 successively outputs a respective parity values 327 corresponding to the M-bit words. The sequence of parity values is checked to determine whether all of the parity values have the expected value (which may be programmable by control circuitry.) If any one of the parity values does not have the expected value, error flag 326 is set.

It should be understood that the hardware stage or bits causing errors can be isolated by transmitting a complex pattern that maintains, for example, even parity on the N-bit and M-bit data buses: For example, the N=64 bit numbers 0x0324A5F3BD39C0FA, 0x71BB721ED48B21CF, and 0x965CF8650C9A0F2E all have even parity. Likewise, each constituent byte of these numbers has even parity. If odd parity is observed on the 64-bit bus while using these patterns, the problematic bit on the bus can be isolated by intentionally introducing odd parity one bit at a time. As an example; assuming a 64-bit interface (MSB[31:0],LSB[31:0]), some additional PAM4 and NRZ patterns that have even parity are: 0x0000000000000000, 0xCCCCCCCCCCCCCCCC, and 0xFFFFFFFFFFFFFFFF. To check LSB[0], odd parity can be introduced, for example, in the PAM-4 signal with the following values: 0x0000000000000001, 0xCCCCCCCCCCCCCCCD, or 0xFFFFFFFFFFFFFFFE. Odd parity can be introduced, for example, in an NRZ with the following values: 0x0000000100000001, 0xCCCCCCCDCCCCCCCD, or 0xFFFFFFFEFFFFFFFE.

By trying all the bits on the bus one at a time, the bit(s) producing errors on the 64-bit bus can be identified. It should be understood that other patterns can be created that maintain even parity on the 8-bit bus, while keeping the failing 64-bit bus bins static to determine whether additional bit errors are being injected between the 64-bit and 8-bit parity checkers.

Figure 4:
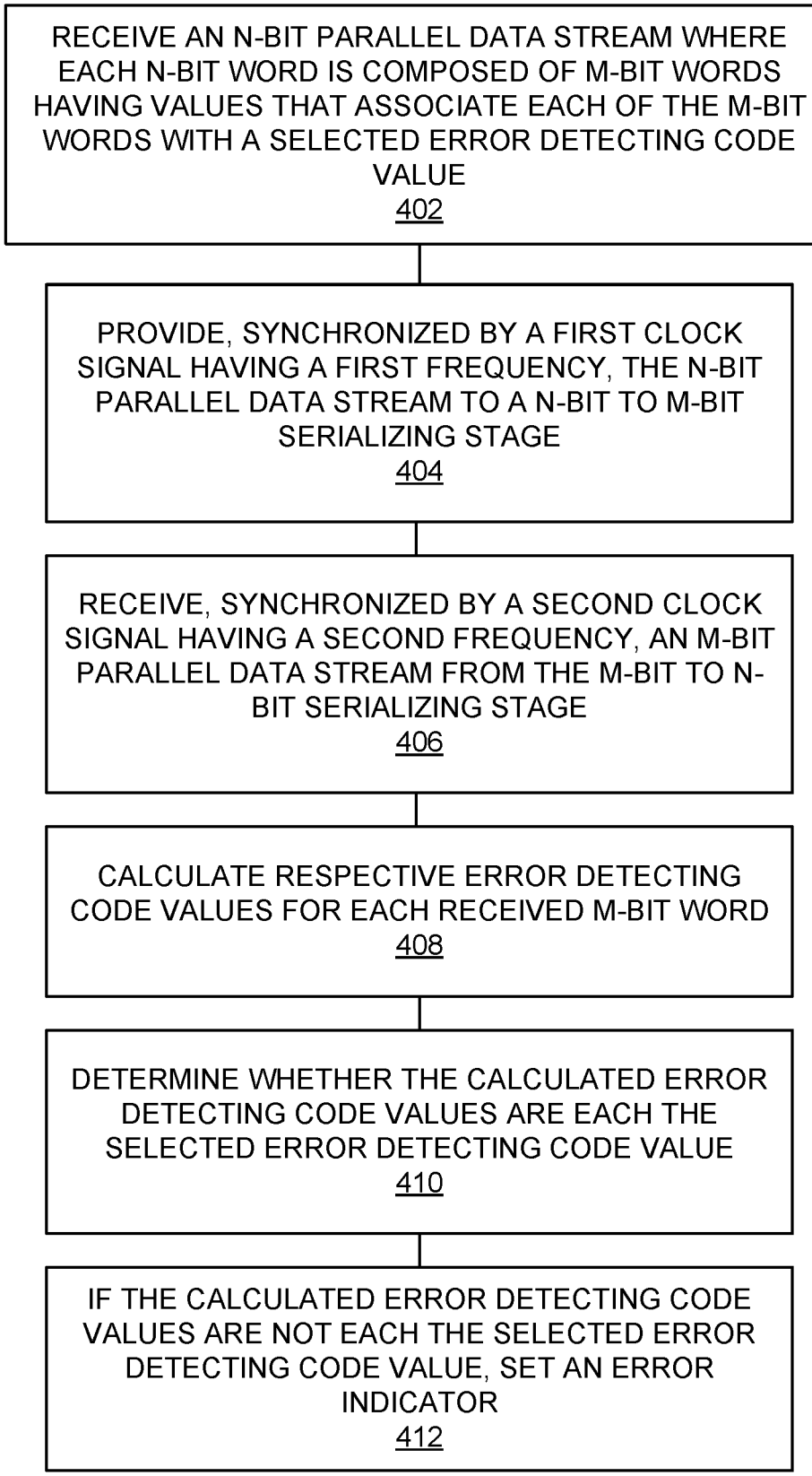
FIG. 4 is a flowchart illustrating a method of operating a serializing stage.

FIG. 4 is a flowchart illustrating a method of operating a serializing stage. The steps illustrated in FIG. 4 may be performed by one or more elements of an integrated circuit, including, but not limited to, serializing stages 100, serializing stages 200, and/or their components. An N-bit parallel data stream where each N-bit word is composed of M-bit words having values that associate each of the M-bit words with a selected error detecting code value is received (402). For example, a test data stream of words that are composed of sub-words with the same parity may be received by a serializing integrated circuit. After zero or more stages of serialization, this (possibly partially serialized down to N-bit words) test data stream may be composed of N-bit words where the value of each of the M-bit words that constitute each N-bit word evaluate to the same parity value.

Synchronized by a first clock signal having a first frequency, the N-bit parallel data stream is provided to an N-bit to M-bit serializing stage (404). For example, N-bit register 112, synchronized to the CK1 domain 110, may provide an N-bit data stream to N-bit to M-bit MUX 124. This N-bit data stream may be composed of N-bit words where the value of each of the M-bit words that constitute each N-bit word evaluate to the same parity value.

Synchronized by a second clock signal having a second frequency, an M-bit parallel data stream is received from the M-bit to N-bit serializing stage (406). For example, M-bit register 122, which is synchronized to the CK2 domain 120, may receive an M-bit data stream from N-bit to M-bit MUX 124. Respective error detecting code values are calculated for each received M-bit word (408). For example, M-bit parity calculation circuitry 125 may calculate parity values for each of the M-bit words in the data stream that is output by M-bit register 122.

It is determined whether the calculated error detecting code values are each the selected error detecting code value (410). For example, error condition indication circuitry 126 may determine whether the parity values output by M-bit parity calculation over a selected set of M-bit words all have the same parity value. If the calculated error detecting code values are not each the selected error detecting code value, an error indicator is set (412). For example, if one or more of the M-bit words evaluates to an unexpected parity value, an error flag, bit, or signal may be asserted to signal that a parity error occurred over the selected set of M-bit words.

Figure 5:
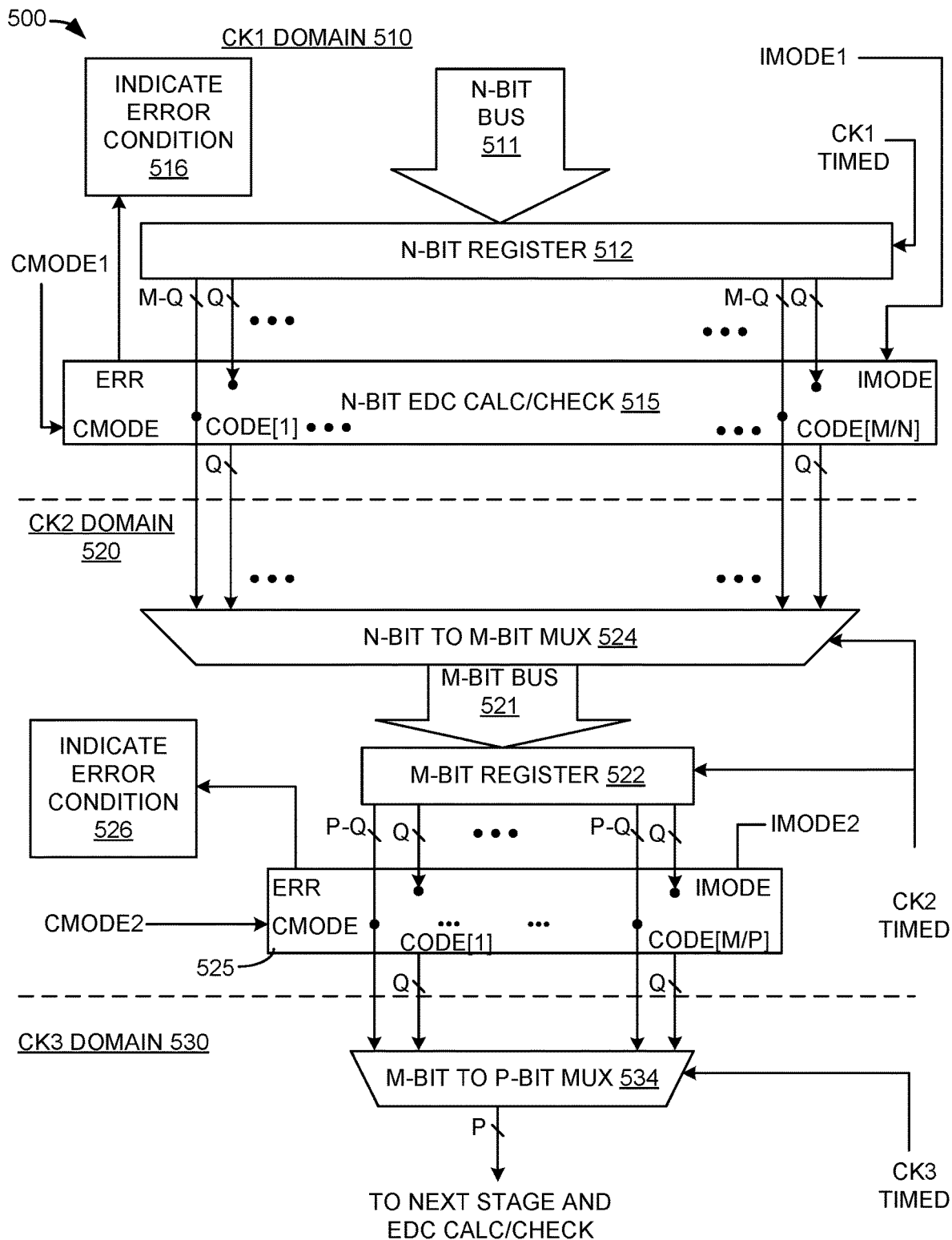
FIG. 5 is a block diagram illustrating testable serializing stages.

FIG. 5 is a block diagram illustrating testable serializing stages. In FIG. 5, serializing stages 500 comprise first clock domain (CK1) 510, second clock domain (CK2) 520, and third clock domain (CK3) 530. In an embodiment, serializing stages 500 are part of an integrated circuit (e.g., memory integrated circuit, serializer/deserializer integrated circuit, processor integrated circuit, etc.) First clock domain CK1 510, second clock domain CK2 520, and third clock domain CK3 530 are synchronized by timing references (e.g., CK1, CK2, and CK3) that are switching at different frequencies. CK1 domain 510 includes an N-bit bus 511, N-bit register 512, and N-bit EDC calculation and/or check circuitry 515. CK2 domain includes N-bit to M-bit multiplexor (MUX) 524, M-bit bus 521, M-bit register 522, M-bit EDC calculation and/or check circuitry 525, and error condition indicator 526. CK3 domain includes M-bit to P-bit multiplexor (MUX) 534 and may include additional circuitry (such as registers and EDC calculation and/or check circuitry) that, for the sake of brevity, is not shown in FIG. 5.

N-bit bus 511 is input to N-bit register 512. N-bit register 512 is synchronized (e.g., clocked) to latch the values from N-bit bus 511 based on a CK1 timed signal. The output of N-bit register 512 is input to N-bit EDC calc/check circuitry 515. Based on being enabled by one or more control signals (CMODE1), N-bit EDC calc/check circuitry 515 calculates an EDC value for the received N-bit words. If the EDC value does not match an expected EDC value (which may be optionally selected by one or more control signals—e.g., CMODE1), EDC calc/check circuitry 515 will assert an output error signal (ERR) that is received by error condition indicator 516.

A second one or more control signals enables (at least) one of two modes that EDC calc/check circuitry 515 may be operated. A first mode (e.g., normal mode) allows all of the N-bits input to N-bit EDC calc/check circuitry 515 to be passed onto N-bit to M-bit MUX 524 (either directly or via one or more of the CODE[ ] signal outputs from N-bit EDC calc/check circuitry 515.) A second mode (e.g., test mode), replaces Q bits of the N-bit word with the Q-bit EDC code calculated over the remaining (i.e., not replaced) N-Q bits of the N-bit word. These Q-bits are output via corresponding CODE[ ] outputs of N-bit EDC calc/check circuitry 515 and are provided to MUX 524 as part of an N-bit word. Thus, it should be understood that when N-bit EDC calc/check circuitry 515 is operated in the second mode, N-bit EDC calc/check circuitry 515 is calculating a Q-bit EDC code that corresponds to the N-Q bits that are not to be replaced. This Q-bit code is then provided to MUX 524 in place of a selected Q number of bits.

MUX 524 receives N-bits from register 512 when EDC calc/check circuitry 515 is being operated in the first mode, and sequentially outputs a series of M-bit words to M-bit bus 521. MUX 524 receives N-Q bits from register 512 when EDC calc/check circuitry 515 is being operated in the second mode, and receives Q-bits of EDC information from EDC calc/check circuitry 515. MUX 524 serializes from N-bits to M-bits the received N-bits and sequentially outputs a series of M-bit words to M-bit bus 521.

The timing of the series is synchronized (e.g., clocked) to output the M-bit words, serially, to M-bit bus 521 based on a CK2 timed signal. M-bit bus 521 is input to M-bit register 522. M-bit register 522 is synchronized (e.g., clocked) to latch the values from M-bit bus 521 based on a CK2 timed signal. The output of M-bit register 522 is input to M-bit EDC calc/check circuitry 525. Based on being enabled by one or more control signals (CMODE2), M-bit EDC calc/check circuitry 525 calculates an EDC value for the received M-bit words. If the EDC value does not match an expected EDC value (which may be optionally selected by one or more control signals—e.g., CMODE2), EDC calc/check circuitry 525 will assert an output error signal (ERR) that is received by error condition indicator 526.

A second one or more control signals enables (at least) one of two modes that EDC calc/check circuitry 525 may be operated. A first mode (e.g., normal mode) allows all of the M-bits input to M-bit EDC calc/check circuitry 525 to be passed onto M-bit to P-bit MUX 534 (either directly or via one or more of the CODE[ ] signal outputs from N-bit EDC calc/check circuitry 515.) A second mode (e.g., test mode), replaces Q bits of the M-bit word with the Q-bit EDC code calculated over the remaining (i.e., not replaced) M-Q bits of the M-bit word. Thus, it should be understood that when M-bit EDC calc/check circuitry 525 is operated in the second mode, M-bit EDC calc/check circuitry 525 is calculating a Q-bit EDC code that corresponds to the M-Q bits that are not to be replaced. These Q-bits are output via corresponding CODE[ ] outputs of M-bit EDC calc/check circuitry 525 and are provided to MUX 524 as part of an M-bit word.

Figure 6:
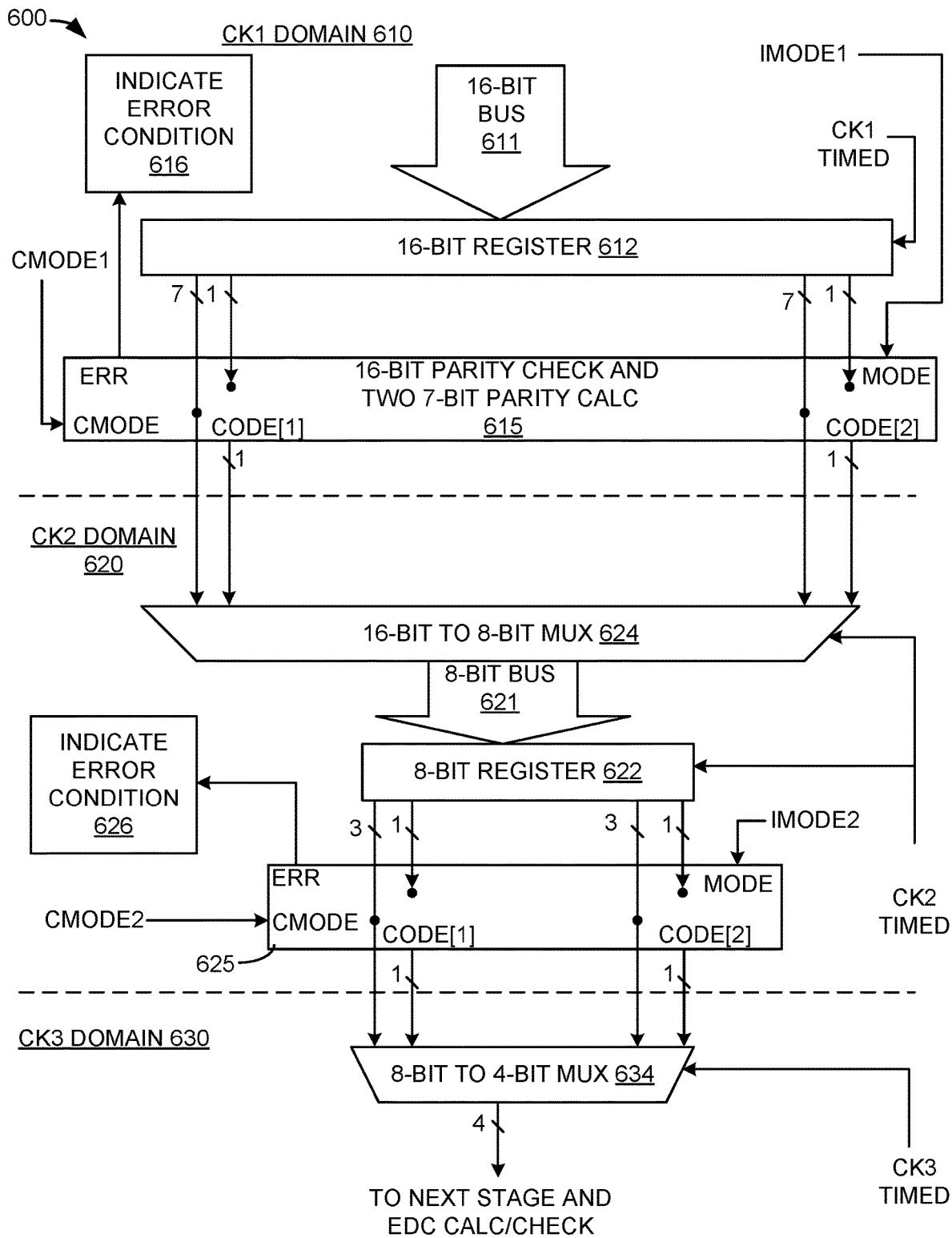
FIG. 6 is a block diagram illustrating 8-bit and 4-bit testable serializing stages.

FIG. 6 is a block diagram illustrating 16-bit and 8-bit testable serializing stages. In FIG. 6, serializing stages 600 comprise first clock domain (CK1) 610, second clock domain (CK2) 620, and third clock domain (CK3) 630. In an embodiment, serializing stages 600 are part of an integrated circuit (e.g., memory integrated circuit, serializer/deserializer integrated circuit, processor integrated circuit, etc.) First clock domain CK1 610, second clock domain CK2 620, and third clock domain CK3 630 are synchronized by timing references (e.g., CK1 and CK2) that are switching at different frequencies. CK1 domain 610 includes 16-bit bus 611, 16-bit register 612, and 16-bit parity check and two 7-bit parity calculation circuits 615. CK2 domain includes 16-bit to 8-bit multiplexor (MUX) 624, 8-bit bus 621, 8-bit register 622, 8-bit parity check and two 3-bit parity calculation circuits 625, and error condition indicator 626. CK3 domain includes 8-bit to 4-bit multiplexor (MUX) 634 and may include additional circuitry (such as registers and parity calculation and/or check circuitry) that, for the sake of brevity, is not shown in FIG. 6

16-bit bus 611 is input to 16-bit register 612. 16-bit register 612 is synchronized (e.g., clocked) to latch the values from 16-bit bus 611 based on a CK1 timed signal. The output of 16-bit register 612 is input to parity calc/check circuitry 615. Based on being enabled by one or more control signals (CMODE1), parity calc/check circuitry 615 calculates a parity value for the received 16-bit words. If the parity value does not match an expected parity value (which may be optionally selected by one or more control signals— e.g., CMODE1), parity calc/check circuitry 615 will assert an output error signal (ERR) that is received by error condition indicator 616.

A second one or more control signals enables (at least) one of two modes that parity calc/check circuitry 615 may be operated. A first mode (e.g., normal mode) allows all of the 16-bits input to parity calc/check circuitry 615 to be passed onto 16-bit to 8-bit MUX 624 (either directly or via a corresponding CODE[ ] signal output from parity calc/check circuitry 615.) A second mode (e.g., test mode), replaces 1 bit of each of the 8-bit words with a parity value calculated over the remaining (i.e., not replaced) 7 bits of the 8-bit word. This parity bit is output via the corresponding CODE[ ] output of parity calc/check circuitry 615 and is provided to MUX 624 as part of an 8-bit word. Thus, it should be understood that when parity calc/check circuitry 615 is operated in the second mode, parity calc/check circuitry 615 is calculating two parity values/bits that corresponds to the 7 bits of each 8-bit word that are not to be replaced. This parity bit is then provided to MUX 624 in place of a selected bit.

MUX 624 receives 16-bits from register 612 when parity calc/check circuitry 615 is being operated in the first mode and sequentially outputs a series of 8-bit words to 8-bit bus 621. MUX 624 receives 14 bits from register 612 when EDC calc/check circuitry 615 is being operated in the second mode, and receives 2-bits of parity information (one for each 8-bit word that makes of the received 16-bit word) from parity calc/check circuitry 615. MUX 624 serializes from 16-bits to sequentially output a series of 8-bit words to 8-bit bus 621.

The timing of the series is synchronized (e.g., clocked) to output the 8-bit words, serially, to 8-bit bus 621 based on a CK2 timed signal. 8-bit bus 621 is input to 8-bit register 622. 8-bit register 622 is synchronized (e.g., clocked) to latch the values from 8-bit bus 621 based on a CK2 timed signal. The output of 8-bit register 622 is input to parity calc/check circuitry 625. Based on being enabled by one or more control signals (CMODE2), parity calc/check circuitry 625 calculates respective parity value for each the received 8-bit words. If the EDC value does not match an expected parity value (which may be optionally selected by one or more control signals—e.g., CMODE2), parity calc/check circuitry 625 will assert an output error signal (ERR) that is received by error condition indicator 626.

A second one or more control signals enables (at least) one of two modes that parity calc/check circuitry 625 may be operated. A first mode (e.g., normal mode) allows all of the 8-bits input to parity calc/check circuitry 625 to be passed onto 8-bit to 4-bit MUX 634 (either directly or via the corresponding CODE[ ] output from parity calc/check circuitry 615.) A second mode (e.g., test mode), replaces 2 bits of each of the 4-bit words that make up the received 8-bit word with the parity value calculated over the remaining (i.e., not replaced) 3 bits of the 4-bit word. Thus, it should be understood that when parity calc/check circuitry 625 is operated in the second mode, parity calc/check circuitry 625 is calculating a parity value that corresponds to the 3 bits that are not to be replaced. The calculated parity bits are output via the corresponding CODE[ ] output of parity calc/check circuitry 625 and are provided to MUX 624 as part of a 4-bit word.

Figure 7:
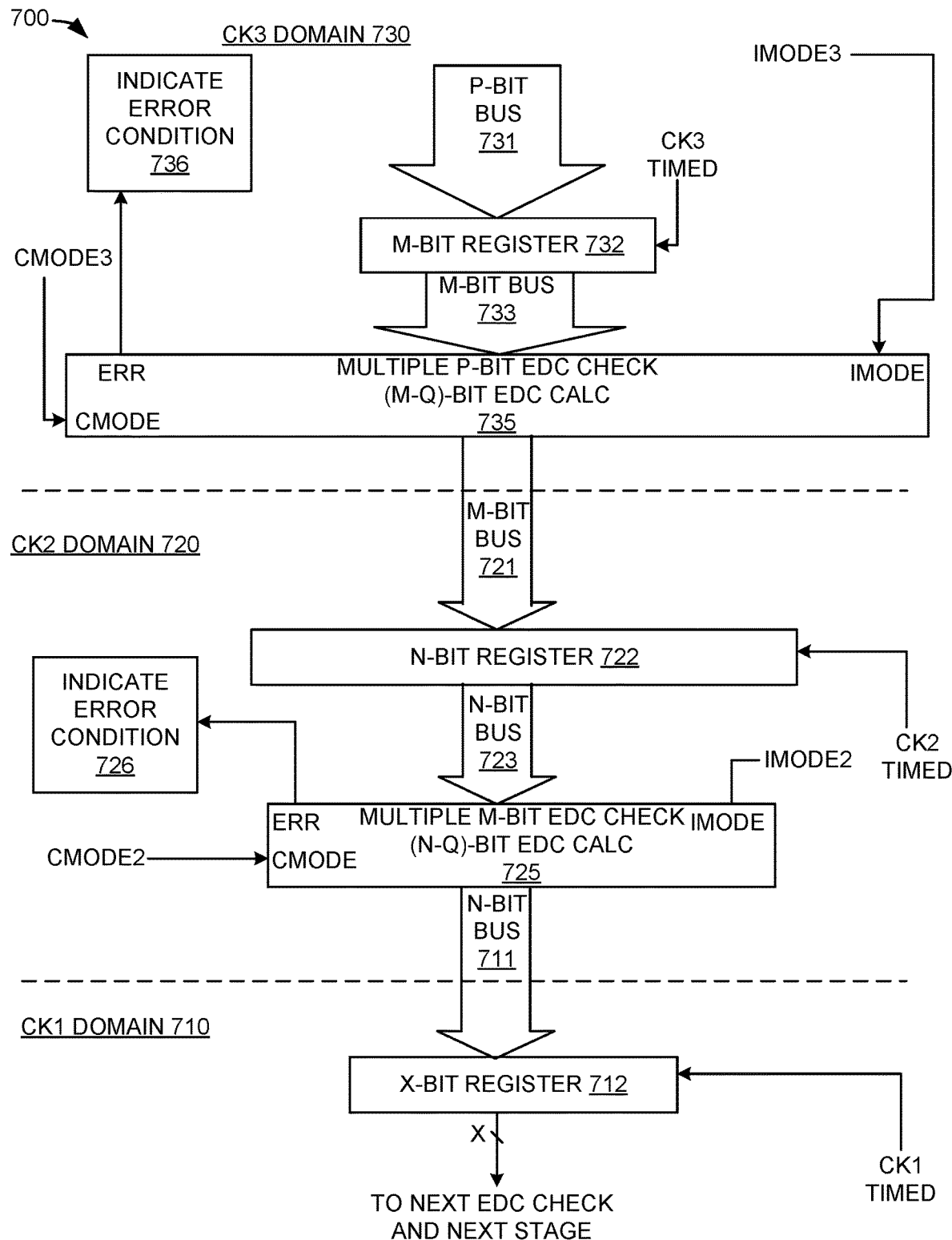
FIG. 7 is a block diagram illustrating testable deserializing stages.

FIG. 7 is a block diagram illustrating testable deserializing stages. In FIG. 7, deserializing stages 700 comprise first clock domain (CK1) 710, second clock domain (CK2) 720, and third clock domain (CK3) 730. In an embodiment, deserializing stages 700 are part of an integrated circuit (e.g., memory integrated circuit, serializer/deserializer integrated circuit, processor integrated circuit, etc.) First clock domain CK1 710, second clock domain CK2 720, and third clock domain CK3 730 are synchronized by timing references (e.g., CK1, CK2, and CK3) that are switching at different frequencies. CK3 domain 730 includes P-bit bus 731, M-bit register 732, M-bit bus 733, EDC calculation/check circuitry 735, and error condition indicator 736. CK2 domain 720 receives M-bit bus 721 from CK3 domain 730. CK2 domain 720 includes N-bit register 722, N-bit bus 723, EDC calculation/check circuitry 725, and error condition indicator 726. CK1 domain includes X-bit register 712 and may include additional circuitry (such as registers and EDC calculation and/or check circuitry) that, for the sake of brevity, is not shown in FIG. 7.

P-bit bus 731 is input to M-bit register 732. M-bit register 732 is synchronized (e.g., clocked) to latch the values from P-bit bus 731 based on a CK3 timed signal. M-bit register 732 is clocked such that P-bits at a time are latched into M-bit register 732. This effectively demultiplexes (deserializes) a P-bit data stream into an M-bit data stream, where M>P. The output of M-bit register 732 is input to EDC calc/check circuitry 735. Based on being enabled by one or more control signals (CMODE3), EDC calc/check circuitry 735 checks the EDC value for each of the received P-bit words. If the EDC value does not match an expected EDC value (which may be optionally selected by one or more control signals—e.g., CMODE3), EDC calc/check circuitry 735 will assert an output error signal (ERR) that is received by error condition indicator 736.

A second one or more control signals enables (at least) one of two modes that EDC calc/check circuitry 735 may be operated. A first mode (e.g., normal mode) allows all of the M-bits input to EDC calc/check circuitry 735 to be passed onto N-bit register 722. A second mode (e.g., test mode), replaces Q bits of the M-bit word with the Q-bit EDC code calculated over the remaining (i.e., not replaced) M-Q bits of each M-bit word. Thus, it should be understood that when EDC calc/check circuitry 735 is operated in the second mode, EDC calc/check circuitry 735 is calculating a Q-bit EDC code that corresponds to the M-Q bits that are not to be replaced. This Q-bit code is then provided to N-bit register 722 via M-bit bus 721 in place of a selected Q number of bits.

M-bit bus 721 is input to N-bit register 722. N-bit register 722 is synchronized (e.g., clocked) to latch the values from M-bit bus 721 based on a CK2 timed signal. N-bit register 722 is clocked such that M-bits at a time are latched into N-bit register 722. This effectively demultiplexes (deserializes) a M-bit data stream into an N-bit data stream, where N>M. The output of N-bit register 722 is input to EDC calc/check circuitry 725. Based on being enabled by one or more control signals (CMODE2), EDC calc/check circuitry 725 checks the EDC value for each of the received M-bit words. If the EDC value does not match an expected EDC value (which may be optionally selected by one or more control signals—e.g., CMODE2), EDC calc/check circuitry 725 will assert an output error signal (ERR) that is received by error condition indicator 726.

A second one or more control signals enables (at least) one of two modes that EDC calc/check circuitry 725 may be operated. A first mode (e.g., normal mode) allows all of the N-bits input to EDC calc/check circuitry 725 to be passed onto X-bit register 712. A second mode (e.g., test mode), replaces Q bits of the N-bit word with the Q-bit EDC code calculated over the remaining (i.e., not replaced) N-Q bits of each N-bit word. Thus, it should be understood that when EDC calc/check circuitry 725 is operated in the second mode, EDC calc/check circuitry 725 is calculating a Q-bit EDC code that corresponds to the N-Q bits that are not to be replaced. This Q-bit code is then provided to X-bit register 712 via N-bit bus 711 in place of a selected Q number of bits.

Figure 8:
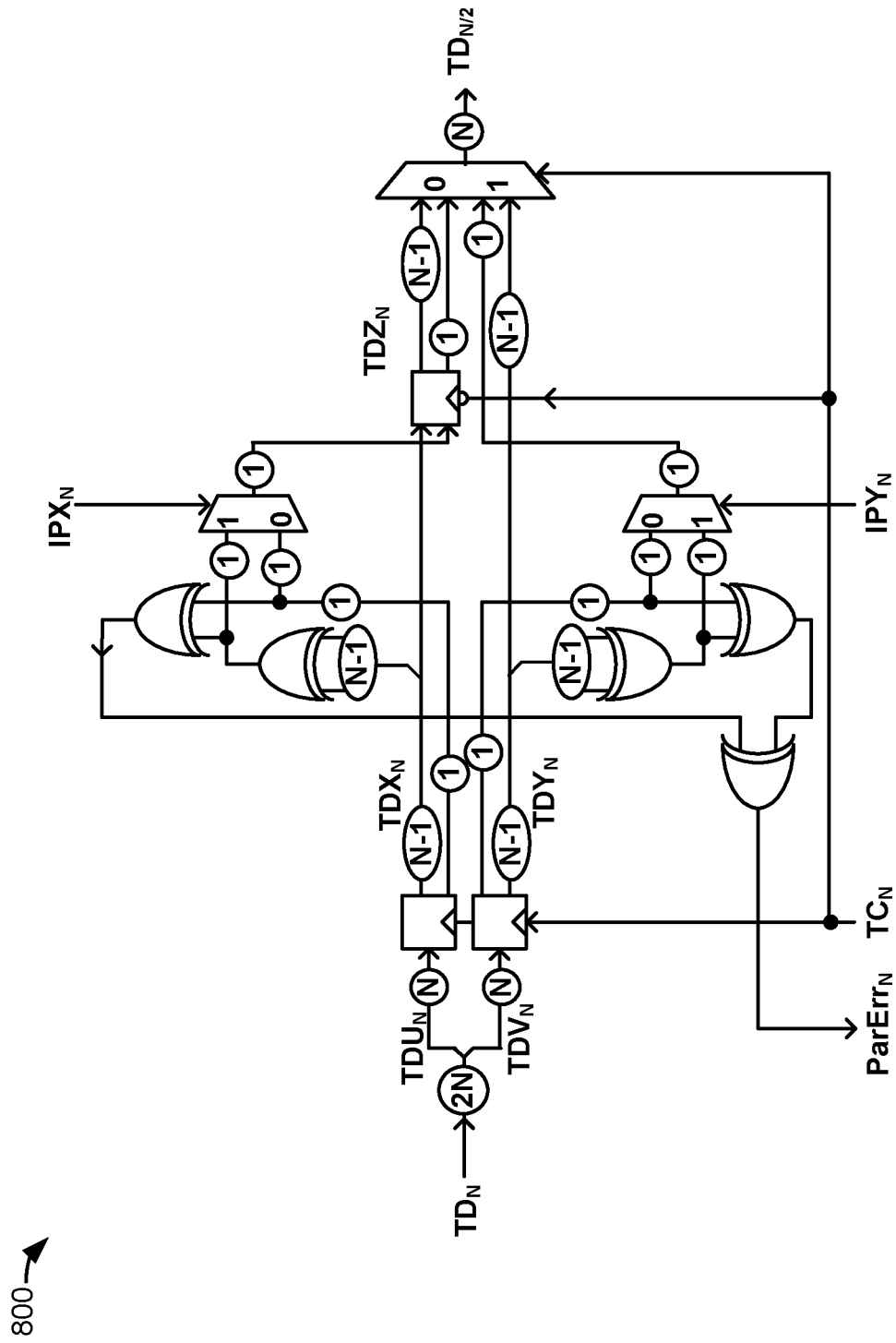
FIG. 8 is a diagram illustrating serializing stage.

FIG. 8 is a diagram illustrating a serializing stage. Serializing stage 800 may be considered an example of serializing stage 500 and/or serializing stage 600. The insertion of parity by a serializing stage (and/or the checking of parity by a serializing stage) may be enabled by a control register (not shown in the Figures). For example, in FIG. 8, the IPXN and IPYN controls signals may be determined by one or more bits in a control register field. Typically, parity generation will be enabled at one stage and be checked at a later (different) stage, to check for errors in the intervening stages.

Figure 9:
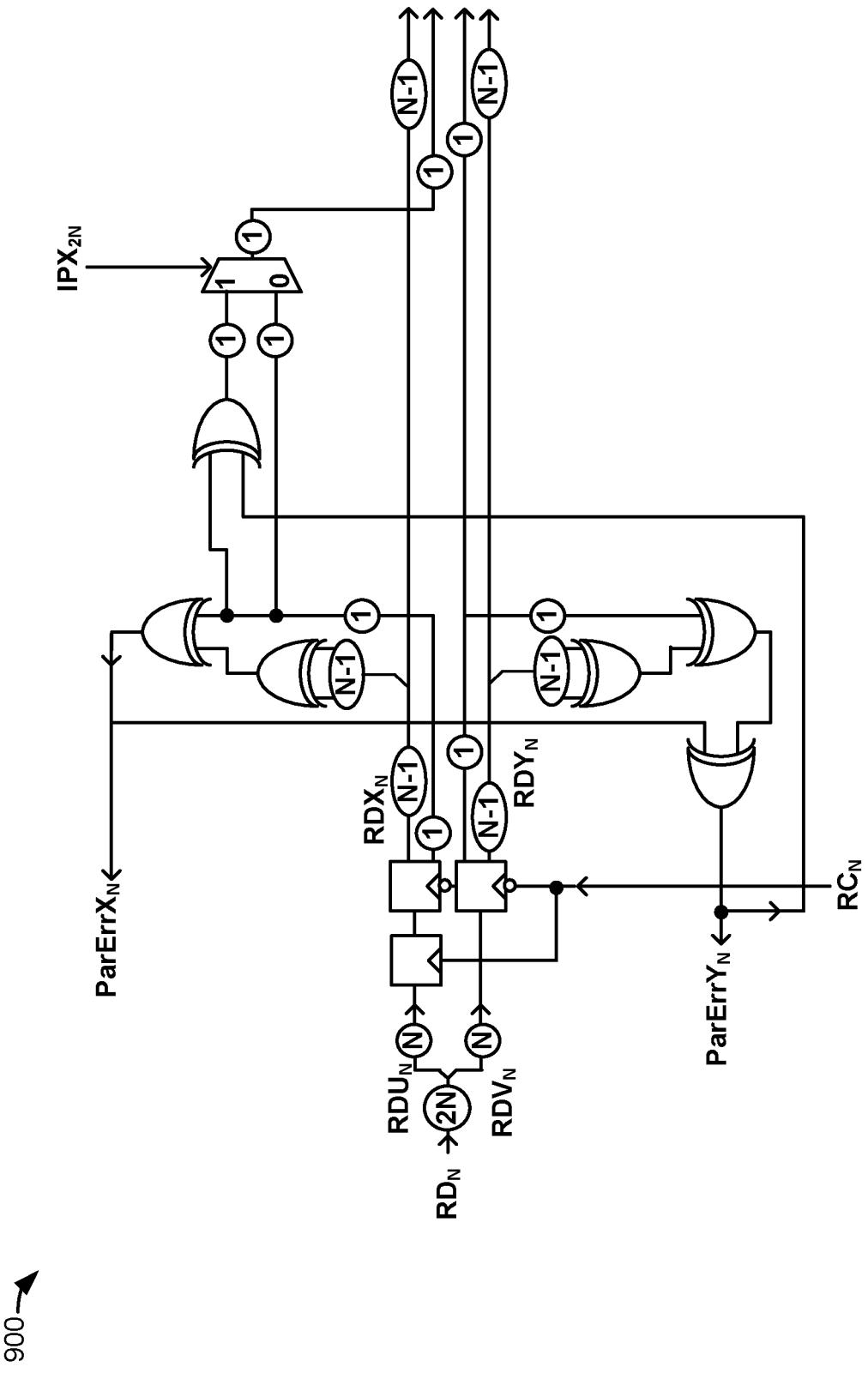
FIG. 9 is a diagram illustrating a deserializing stage.

FIG. 9 is a diagram illustrating a deserializing stage. Deserializing stage 900 may be considered and example of deserializing stage 700. The insertion of parity by a deserializing stage (and/or the checking of parity by a deserializing stage) may be enabled by a control register (not shown in the Figures). For example, in FIG. 9, the IPX2N controls signal may be determined by one or more bits of a control register field. Typically, parity generation will be enabled at one stage and be checked at a later (different) stage, to check for errors in the intervening stages.

It should be understood that it is possible to generate and/or check odd parity as well as even parity. Even parity generation/checking is shown in FIGS. 8 and 9. An odd parity mode could be implemented by adding, for example, a multiplexer (e.g., controlled by a bit in a control register field) in the parity generation and check paths which inverted the parity signals (not shown in the Figures). This additional functionality of being able to select the type of parity generated and/or checked increases the number of bit combinations that are be testable for errors.

FIG. 10 is a diagram illustrating examples of parity insertion by serializing stages. In FIGS. 10, the notation P( ) indicates the parity value for the bits within the parenthesis. For example, P(abc) is equal to the parity of the bits a, b, and c. In FIG. 10, an example input stage receives an 8-bit input word. Parity is inserted by stage #1 into the 8-bit input word by replacing a selected bit (e.g., bit 'A') with a parity value that is calculated over the remaining 7 bits. Thus, the 8 bits passed to stage #2 are P(BCDEFGH), B, C, D, E, F, and H. Parity is inserted by stage #2 into each 4-bit word to be output from stage #2 by replacing a selected bit from each 4-bit word with parity values that were calculated over the remaining 3 bits of the respective word. Thus, the two 4-bit words output from stage #2 are: (1) P(BCD), B, C, D; and (2) P(FGH), F, G, H. Parity is inserted by stage #3 into each 2-bit word to be output from stage #3 by replacing a selected bit from each 2-bit word with parity values that were calculated over the remaining bit of the respective word. Thus, the four 2-bit words output from stage #3 are: (1) P(B), B, (2) P(D), D, (3) P(F), F, and (4) P(H), H. In FIG. 10, the last stage (stage #4) of serialization does not insert additional parity. Thus, the output from stage #4 is the stream of bits P(B), B, P(D), D, P(F), F, P(H), H.

It should be understood from FIG. 10 and the other Figures, that each successive serializing stage outputs data at an integer multiple (e.g., x2, x4, etc.) of the bitrate of the previous stage, but outputs at this rate using only a fraction (e.g., ÷2, ÷4, etc.) number of ports/wires. Thus, the total information bandwidth output from each serializer stage is the same. For example, a given stage of serializer may receive 4 bits at a time at a rate of 1 GHz (i.e., 4-bits×1 GHz=4 Gbit/s.) The output from this stage may be serialized down to 2 bits at a time at a rate of 2 GHz. Thus, the information bandwidth supplied to a stage, and the information bandwidth output by that stage are the same. (i.e., 2-bits×2 GHz=4 Gbit/s).

Figure 11:
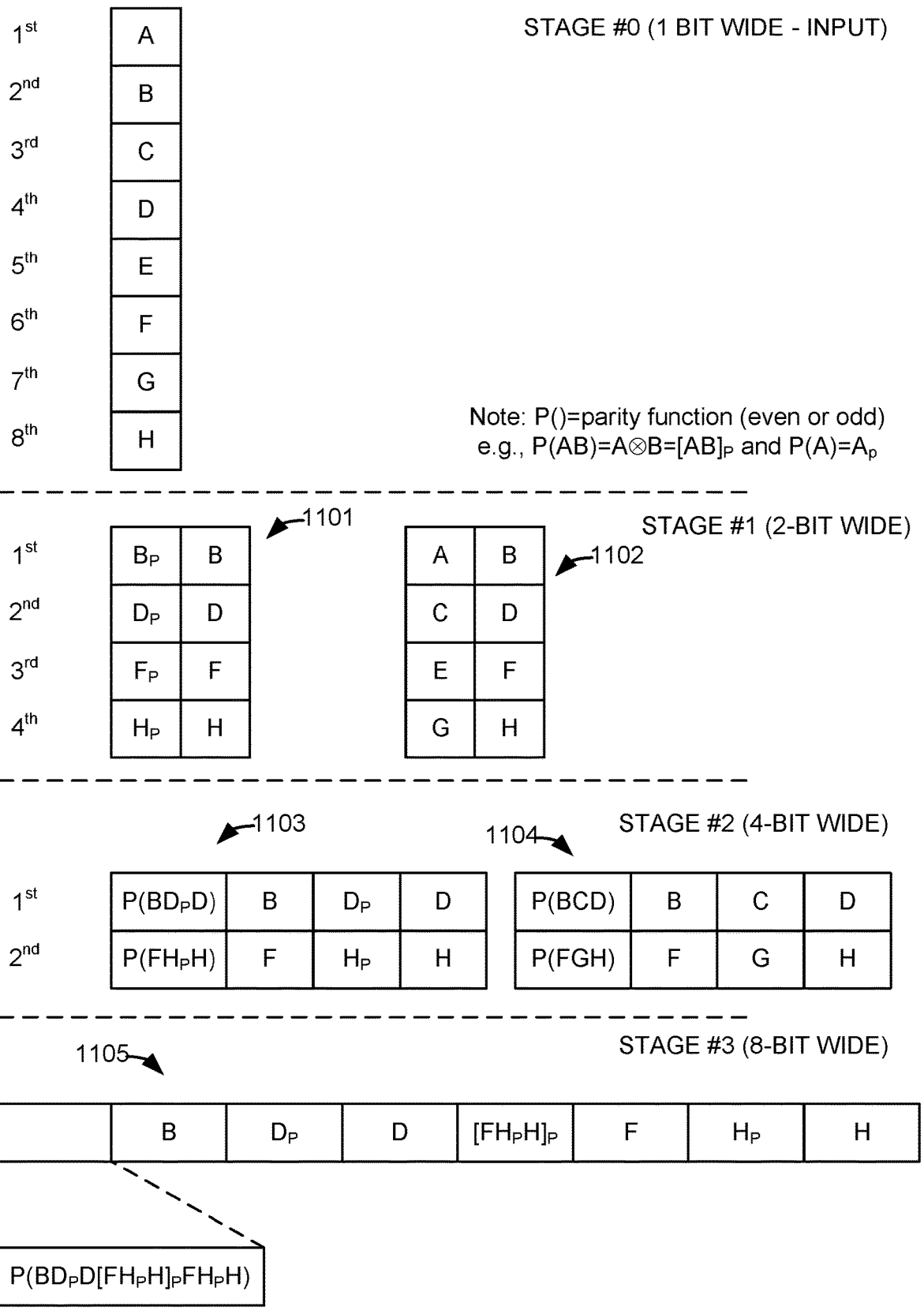
FIG. 11 is a diagram illustrating examples of parity insertion by deserializing stages.

FIG. 11 is a diagram illustrating examples of parity insertion by deserializing stages. In FIG. 11, the notation P( ) indicates the parity value for the bits within the parenthesis. Likewise, the subscript "P" indicates the parity value for the bits non-subscripted element that precedes the subscript. For example, $A_P$ is equal to the parity of the bit A and $[abc]_P$ is equal to P(abc).

In FIG. 11, an example input stage (stage #0) receives a 1 bit wide input stream A, B, C, D, E, F, G, H. Deserializing stage #1 produces a stream of 2-bit words. In the 2-bit stream example 1102, parity is not inserted into the deserialized stream of 2-bit words. Thus, the output of stage #1 would be, the stream of 2-bit words: (1) A, B; (2) C, D; (3) E, F; and, (4) G, H. In the 2-bit stream example 1101, parity for every other bit is inserted. Thus, the output of stage #1 would be, the stream of 2-bit words: (1) $B_P$, B; (2) $D_P$, D; (3) $F_P$, F; and, (4) $H_P$, H.

Deserializing stage #2 produces a stream of 4-bit words. In the 4-bit stream example 1104, parity is not inserted into example stream 1102. Thus, the output of stage #2 would be, the stream of 4-bit words: (1) P(BCD), B C, D; and, (2) P(FGH) F, G, H. In the 4-bit stream example 1103, parity is inserted into example stream 1101. Thus, the output of stage #2 would be, the stream of 4-bit words: (1) $P(BD_PD)$, B, $D_P$, D; and, (2) $P(FH_PH)$, F, $H_P$, H.

Deserializing stage #3 produces a stream of 8-bit words. In the 8-bit stream example 1105, parity is inserted into example stream 1103. Thus, the output of stage #3 would have the 8-bit word: (1) $P(BD_PD[FH_PH]_PFH_PH)$, B, $D_P$, D, $P(FH_PH)$, F, $H_P$, H.

Figure 12:
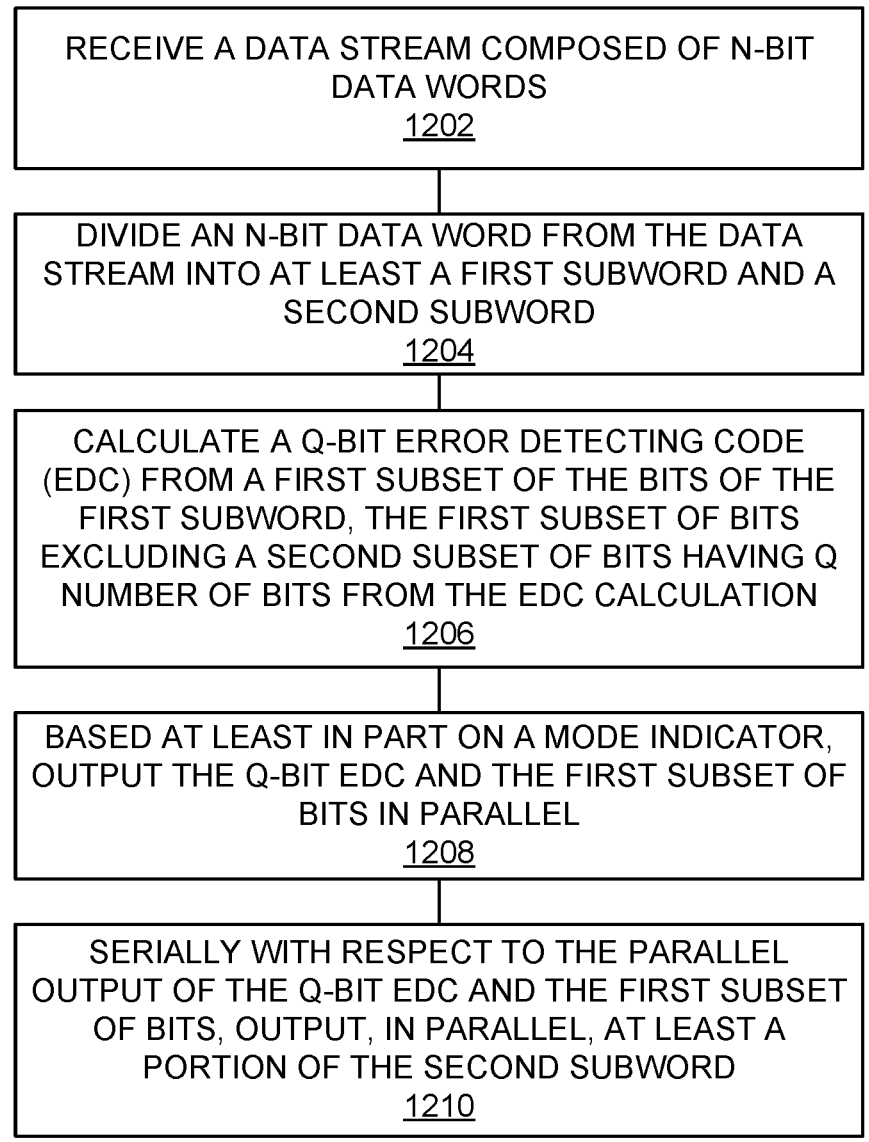
FIG. 12 is a flowchart illustrating a method of error detecting code insertion by a serializing stage.

FIG. 12 is a flowchart illustrating a method of error detecting code insertion by a serializing stage. The steps illustrated in FIG. 12 may be performed by one or more elements of an integrated circuit, including, but not limited to, serializing stages 500, serializing stages 600, and/or their components. A data stream composed of N-bit data words is received (1202). For example, CK1 domain 510 may receive, via N-bit bus 511, a stream of N-bit words to be serialized.

An N-bit data word from the data stream is divided into at least a first sub-word and a second sub-word (1204). For example, EDC calculate/check 515 may divide the N-bits received from N-bit register 512 into M-bit sub-words for further processing. A Q-bit error detecting code (EDC) is calculated from a first subset of the bits of the first sub-word, the first subset of bits excluding a second subset of bits that has Q number of bits from the EDC calculation (1206). For example, EDC calculate/check 515 may calculate, for each M-bit sub-word received, a Q bit EDC code corresponding to (M-Q) number of bits that are, when in a test type mode, to be passed to the next serializing stage unmodified.

Based at least in part on a mode indicator, the Q-bit EDC and the first subset of bits are output in parallel (1208). For example, based on a control signal that indicates EDC calculate/check 515 should insert an EDC (e.g., to operate in a test type mode), EDC calculate/check 515 replace Q bits of each M-bit word with a corresponding Q-bit EDC calculated from the remaining bits being output and passes this word to MUX 524. MUX 524 then outputs the Q-bit EDC and the remaining bits in parallel with each other.

Serially with respect to the parallel output of the Q-bit EDC and the first subset of bits, at least a portion of the second sub-word is output in parallel (1210). For example, MUX 524 may output another M-bit word that is unmodified. In another example, MUX 524 may output a Q-bit EDC code in parallel with the remaining bits from a second M-bit sub-word.

Figure 13:
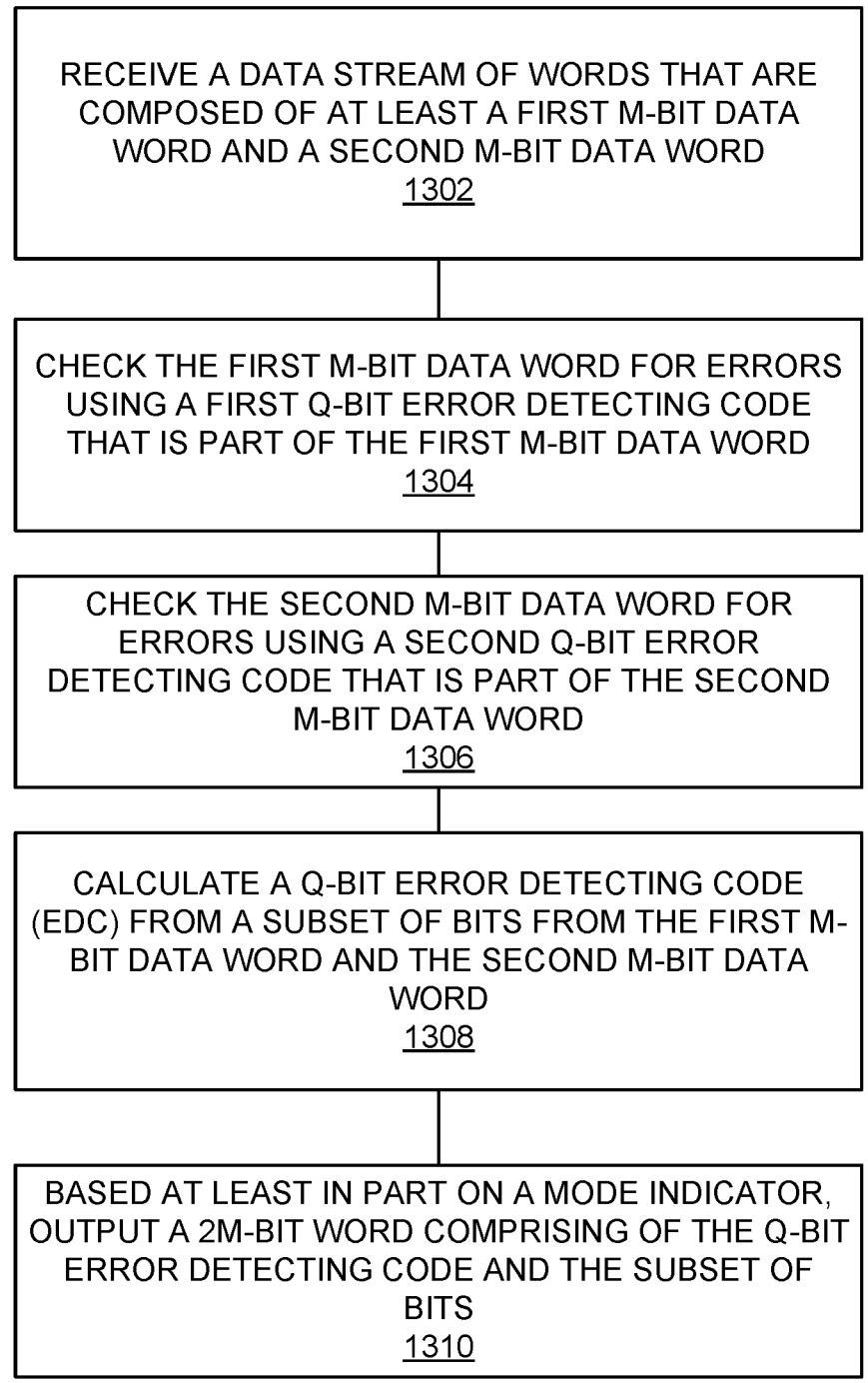
FIG. 13 is a flowchart illustrating a method of error detecting code insertion by a deserializing stage.

FIG. 13 is a flowchart illustrating a method of error detecting code insertion by a deserializing stage. The steps illustrated in FIG. 13 may be performed by one or more elements of an integrated circuit, including, but not limited to, deserializing stages 700 and/or their components. A data stream of words that are composed of at least a first M-bit data word and a second M-bit data word is received (1302). For example, M-bit register 732 may receive a stream of N-bit words where each N-bit word is composed of at least two M-bit sub-words.

The first M-bit data word is checked for errors using a first Q-bit error detecting code that is part of the first M-bit data word (1304). For example, EDC calculate/check 735 may check a first M-bit sub-word received from M-bit register 732 for errors using a Q-bit EDC that is part of the first M-bit sub-word. The second M-bit data word is checked for errors using a second Q-bit error detecting code that is part of the second M-bit data word (1306). For example, EDC calculate/check 735 may check a first M-bit sub-word received from M-bit register 732 for errors using a Q-bit EDC that is part of the first M-bit sub-word.

A Q-bit error detecting code based on at least a subset of bits from the first M-bit data word and the second M-bit data word is calculated (1308). For example, Q number of EDC bits may be calculated by EDC calculate/check 725 based on 2M-Q number of bits selected from the two M-bit sub-words deserialized by N-bit register 722. Based at least in part on a mode indicator, a word having at least 2M-bits that comprises the Q-bit EDC and the subset of bits is output (1310). For example, based on being in a test type mode, EDC calculate/check 725 may replace Q number of bits received from N-bit register 722 with a Q-bit EDC calculated over the remaining (i.e., non-replaced) bits.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of stages 100, stages 200, stages 500, stages 600, stages 700 and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 14:
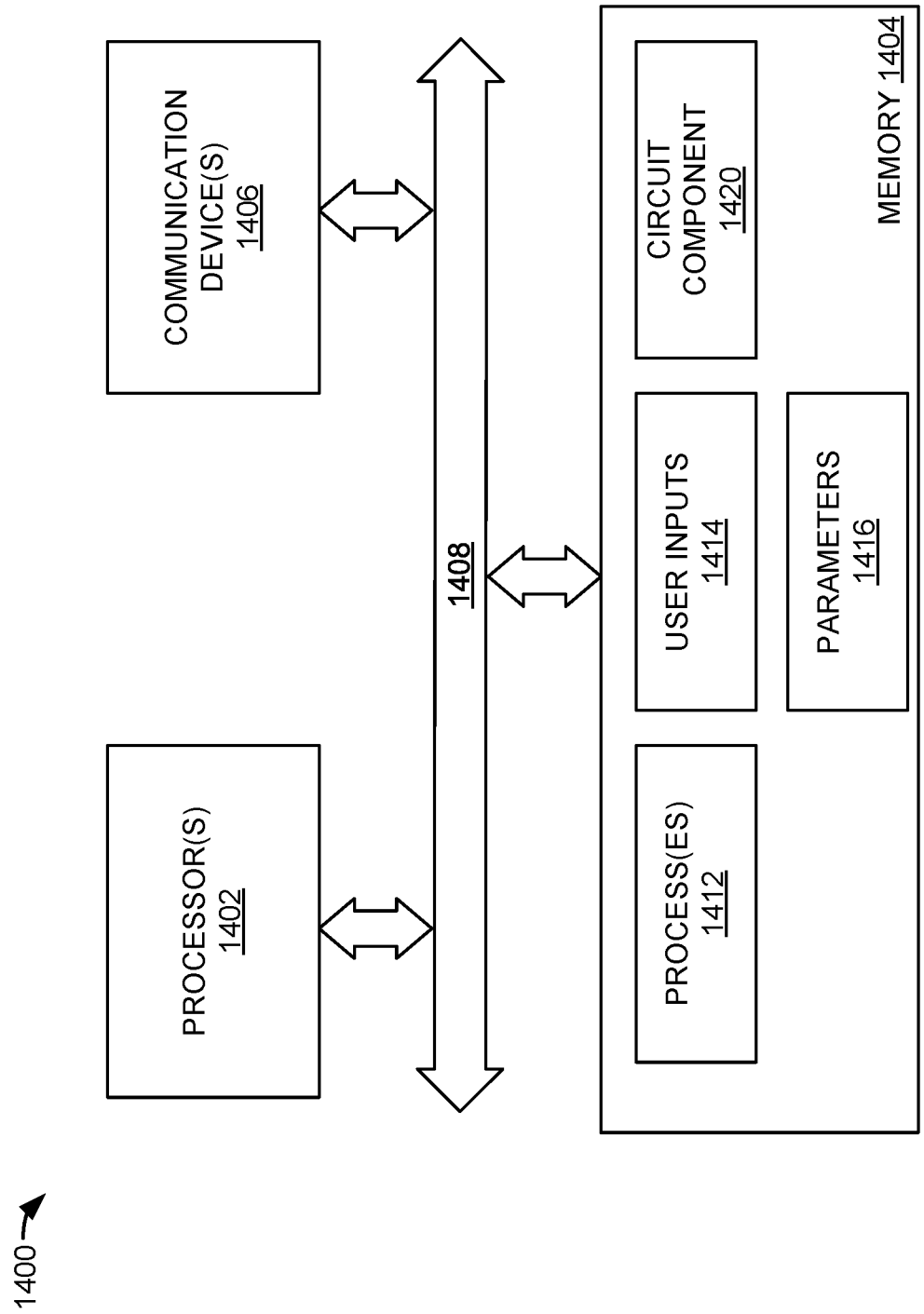
FIG. 14 is a block diagram of a processing system.

FIG. 14 is a block diagram illustrating one embodiment of a processing system 1400 for including, processing, or generating, a representation of a circuit component 1420. Processing system 1400 includes one or more processors 1402, a memory 1404, and one or more communications devices 1406. Processors 1402, memory 1404, and communications devices 1406 communicate using any suitable type, number, and/or configuration of wired and/or wireless connections 1408.

Processors 1402 execute instructions of one or more processes 1412 stored in a memory 1404 to process and/or generate circuit component 1420 responsive to user inputs 1414 and parameters 1416. Processes 1412 may be any suitable electronic design automation (EDA) tool or portion thereof used to design, simulate, analyze, and/or verify electronic circuitry and/or generate photomasks for electronic circuitry. Representation 1420 includes data that describes all or portions of stages 100, stages 200, stages 500, stages 600, stages 700, and their components, as shown in the Figures.

Representation 1420 may include one or more of behavioral, register transfer, logic component, transistor, and layout geometry-level descriptions. Moreover, representation 1420 may be stored on storage media or communicated by carrier waves.

Data formats in which representation 1420 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email.

User inputs 1414 may comprise input parameters from a keyboard, mouse, voice recognition interface, microphone and speakers, graphical display, touch screen, or other type of user interface device. This user interface may be distributed among multiple interface devices. Parameters 1416 may include specifications and/or characteristics that are input to help define representation 1420. For example, parameters 1416 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 1404 includes any suitable type, number, and/or configuration of non-transitory computer-readable storage media that stores processes 1412, user inputs 1414, parameters 1416, and circuit component 1420.

Communications devices 1406 include any suitable type, number, and/or configuration of wired and/or wireless devices that transmit information from processing system 1400 to another processing or storage system (not shown) and/or receive information from another processing or storage system (not shown). For example, communications devices 1406 may transmit circuit component 1420 to another system. Communications devices 1406 may receive processes 1412, user inputs 1414, parameters 1416, and/or circuit component 1420 and cause processes 1412, user inputs 1414, parameters 1416, and/or circuit component 1420 to be stored in memory 1404.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An integrated circuit, comprising:
a first serializing stage circuitry to receive a stream of data words composed of sub-word sized sub-words, the sub-words each having values that associate each of the sub-words with an error detection code value;
a second serializing stage circuitry to time-multiplex the sub-words into a sub-word sized sub-word data stream; and
sub-word stream checking circuitry to receive a received version of the sub-word data stream and to determine whether sub-words of the received version of the sub-word data stream each have values that associate each of the sub-words with an expected error detection code value, wherein there is an integer number, greater than one, of the sub-words in each data word of the stream of data words and the integer number is equal to the size of the data word divided by the size of the sub-words.

2. The integrated circuit of claim 1, further comprising:
circuitry to, if one or more sub-words in the received version of the sub-word data stream does not have a value that associates the one or more sub-words with the expected error detection code value, set an error indicator.

3. The integrated circuit of claim 2, wherein the first serializing stage circuitry is to receive the stream of data words synchronized to a first clock signal having a first frequency.

4. The integrated circuit of claim 3, wherein the second serializing stage circuitry is to transmit the sub-word data stream synchronized to a second clock signal having second frequency, the second frequency to be an integer multiple, greater than one, of the first frequency.

5. The integrated circuit of claim 3, wherein the second serializing stage circuitry is to transmit the sub-word data stream synchronized to a second clock signal having second frequency, the second frequency to be the first integer number times the first frequency.

6. The integrated circuit of claim 5, wherein the error detection code value corresponds to even parity.

7. The integrated circuit of claim 5, wherein the error detection code value corresponds to odd parity.

8. An integrated circuit, comprising:
a register to receive a series of data words, each data word composed of sub-word sized sub-words, the sub-words being proper subsets of bits of the data words, each sub-word to have a value having a first property that associates the value of each sub-word with an error detection code value;
a multiplexor to convert each data word into a sub-word sized data series; and
sub-word series checking circuitry to receive the sub-word sized data series and calculate respective received sub-word error detecting code values and compare the sub-word error detecting code values with corresponding expected sub-word error detecting code values, wherein there is an integer number, greater than one, of sub-words in each data word of the series of data words and the integer number is equal to the size of the data word divided by the size of the sub-words.

9. The integrated circuit of claim 8, further comprising:
circuitry to, if one or more of the sub-word error detecting code values is not equivalent to a corresponding expected sub-word error detecting code values, set an error indicator.

10. The integrated circuit of claim 9, wherein the register is to receive the series of data words synchronized to a first clock signal having a first frequency.

11. The integrated circuit of claim 10, wherein the multiplexor is to transmit the sub-word sized data series synchronized to a second clock signal having second frequency, the second frequency to be an integer multiple, greater than one, of the first frequency.

12. The integrated circuit of claim 10, wherein the multiplexor is to transmit the sub-word sized data series synchronized to a second clock signal having second frequency, the second frequency to be the first frequency multiplied by the integer number.

13. The integrated circuit of claim 12, wherein the expected sub-word error detecting code values correspond to even parity.

14. The integrated circuit of claim 12, wherein the expected sub-word error detecting code values correspond to odd parity.

15. A method of operating an integrated circuit, comprising:
receiving, by serializing circuitry, a stream of data words composed of sub-word sized sub-words, the sub-words each having values that associate each of the sub-words with an error detection code value, wherein there is an integer number of sub-words in each data word of the stream of data words and the integer number is equal to the size of the data word divided by the size of the sub-words;
receiving, by time-multiplexing circuitry, the stream of data words;
transmitting, by the time-multiplexing circuitry, the sub-words as a sub-word sized sub-word data stream; and
receiving, by sub-word stream checking circuitry, a received version of the sub-word data stream; and
determining, by the sub-word stream checking circuitry, whether sub-words of the received version of the sub-word data stream each have values that associate each of the sub-words with an expected error detection code value.

16. The method of claim 15, further comprising:
setting an error indicator if one or more sub-words in the received version of the sub-word data stream does not have a value that associates the one or more sub-words with the expected error detection code value.

17. The method of claim 16, wherein the time-multiplexing circuitry is to receive the stream of data words synchronized to a first clock signal having a first frequency.

18. The method of claim 17, wherein the time-multiplexing circuitry is to transmit the sub-word data stream synchronized to a second clock signal having second frequency, the second frequency to be an integer multiple, greater than one, of the first frequency.

19. The method of claim 17, wherein the time-multiplexing circuitry is to transmit the sub-word data stream synchronized to a second clock signal having second frequency, the second frequency to be the integer number times the first frequency.

20. The method of claim 16, wherein the error detection code value corresponds to a one of even parity and odd parity.

* * * * *